(12) United States Patent
Kao et al.

(10) Patent No.: US 8,129,736 B2
(45) Date of Patent: *Mar. 6, 2012

(54) LIGHT-EMITTING DIODE

(75) Inventors: Lin-Chieh Kao, Caotun Town (TW); Shu-Ying Yang, Gangshan Town (TW)

(73) Assignee: Huga Optotech, Inc., Taichung (TW)

( * ) Notice: Subject to any disclaimer, the term of this patent is extended or adjusted under 35 U.S.C. 154(b) by 206 days.

This patent is subject to a terminal disclaimer.

(21) Appl. No.: 12/426,542

(22) Filed: Apr. 20, 2009

(65) Prior Publication Data
US 2010/0193814 A1    Aug. 5, 2010

(30) Foreign Application Priority Data
Feb. 5, 2009   (TW) .............................. 98103750 A

(51) Int. Cl.
*H01L 33/00*   (2010.01)
(52) U.S. Cl. .................................. 257/98; 257/E33.068
(58) Field of Classification Search ............ 257/79–103, 257/E33.067–E33.069
See application file for complete search history.

(56) References Cited

U.S. PATENT DOCUMENTS

2009/0026476 A1 * 1/2009 Tazima et al. ................... 257/98

* cited by examiner

*Primary Examiner* — Matthew Landau
*Assistant Examiner* — Candice Chan
(74) *Attorney, Agent, or Firm* — Chun-Ming Shih

(57) ABSTRACT

The invention discloses a light-emitting diode which includes a substrate on which a first conducting-type semiconductor layer, an illuminating layer and a second conducting-type semiconductor layer are formed sequentially, a transparent insulating material, a first transparent conducting layer, and a second transparent conducting layer. The top surface of the first conducting-type semiconductor layer includes a first region and a second region surrounded by the first region. Plural pillar-like holes are formed at the first region and protrude into the first conducting-type semiconductor layer. The transparent insulating material fills up the holes. The first transparent conducting layer is formed on the second conducting-type semiconductor layer, and the second transparent conducting layer is formed on the top surface of the transparent insulating material and on the first region.

7 Claims, 15 Drawing Sheets

LIGHT-EMITTING DIODE

BACKGROUND OF THE INVENTION

1. Field of the Invention

The present invention generally relates to a light-emitting diode and a manufacturing method thereof, and more particularly, to a light-emitting diode with high illuminating efficiency and the manufacturing method thereof.

2. Description of the Prior Art

Until now, the light-emitting diode (LED) has been widely applied, such as a keyboard, a backlight module of a mobile phone monitor, an illuminative system of a vehicle, an ornamental lamp, and a remote controlling product, etc. In order to make the LED have higher functional stability and lower energy consumption, the illuminating efficiency of the LED should be required.

Please refer to FIG. 1. FIG. 1 illustrates a well-known light-emitting diode 1. As shown in FIG. 1, the light-emitting diode 1 includes a substrate 10, a n-type GaN layer 11, an illuminating layer 12, a p-type GaN layer 13, and the electrodes 14, 15. In order to conduct the p-type GaN layer 13 and the n-type GaN layer 11 to operate the light-emitting diode 1, the electrode 15 is formed upon the p-type GaN layer 13, and the electrode 14 is formed upon the p-type GaN layer 11.

Theoretically, the illuminating efficiency of the light-emitting diode relates to its internal quantum efficiency and light-extraction efficiency. The internal quantum efficiency is decided by the material property and the quality; the light-extraction efficiency means the radiation proportion emitted from the inside of the light-emitting diode to the environment or the inside of the packaged epoxy resin. Although various light-emitting diodes of different structures have been disclosed, how to increase the light-extraction efficiency and illuminating efficiency of the light-emitting diode is still a question to be overcome urgently.

SUMMARY OF THE INVENTION

Accordingly, a scope of the present invention is to provide a light-emitting diode with high illuminating efficiency.

According to an embodiment of the invention, the light-emitting diode comprises a substrate, a first conducting-type semiconductor layer, a transparent insulating material, an illuminating layer, a second conducting-type semiconductor layer, a first transparent conducting layer, a second transparent conducting layer, a first electrode, and a second electrode.

The first conducting-type semiconductor layer is formed on the substrate and the first conducting-type semiconductor layer has an upper surface. The upper surface comprises a first region and a second region surrounded by the first region. Specifically, a plurality of pillar-like holes is formed in the first region and protrudes into the first conduction-type semiconductor layer. The transparent insulating material is filled into the plurality of pillar-like holes, so that the filled transparent insulating material is about the same height as the plurality of pillar-like holes.

Additionally, the illuminating layer is formed on the second region, and the second conducting-type semiconductor layer is formed on the illuminating layer. The first transparent conducting layer is formed on the second conducting-type semiconductor layer. The second transparent conducting layer is formed on a top surface of the transparent insulating material and the first region. Additionally, the first electrode is formed upon the first transparent conducting layer, and the second electrode is formed upon the second transparent conducting layer.

A scope of the present invention is to provide a light-emitting diode with high illuminating efficiency.

According to an embodiment of the invention, the light-emitting diode comprises a substrate, a first conducting-type semiconductor layer, an illuminating layer, a second conducting-type semiconductor layer, a first transparent conducting layer, a second transparent conducting layer, a first electrode, and a second electrode.

The first conducting-type semiconductor layer is formed on the substrate and the first conducting-type semiconductor layer has an upper surface. The upper surface comprises a first region and a second region surrounded by the first region. The illuminating layer is formed on the second region, and the second conducting-type semiconductor layer is formed on the illuminating layer. The first transparent conducting layer is formed on the second conducting-type semiconductor layer. The second transparent conducting layer is formed on the first region, wherein a plurality of pillar-like holes is formed in the second transparent conducting layer and protrudes into the first conduction-type semiconductor layer. In an embodiment, a transparent insulating material is filled into the plurality of pillar-like holes, so that the filled transparent insulating material is about the same height as the plurality of pillar-like holes. The first electrode is formed upon the first transparent conducting layer, and the second electrode is formed upon the second transparent conducting layer.

A scope of the present invention is to provide a light-emitting diode with high illuminating efficiency.

According to an embodiment of the invention, the light-emitting diode comprises a substrate, a first conducting-type semiconductor layer, an illuminating layer, a second conducting-type semiconductor layer, a first transparent conducting layer, a second transparent conducting layer, a first electrode, and a second electrode.

Wherein, the first conducting-type semiconductor layer is formed on the substrate and the first conducting-type semiconductor layer has an upper surface. The upper surface comprises a first region and a second region surrounded by the first region. And, a plurality of pillar-like holes is formed in the first region and protrudes into the first conduction-type semiconductor layer.

Additionally, the illuminating layer of the LED is formed on the second region, the second conducting-type semiconductor layer is formed on the illuminating layer, and the first transparent conducting layer is formed on the second conducting-type semiconductor layer. The second transparent conducting layer is coated on the surface of the plurality of pillar-like holes and the first region. The first electrode is formed upon the first transparent conducting layer, and the second electrode is formed upon the second transparent conducting layer.

Compared to prior arts, the light-emitting diode of the invention includes the plurality of pillar-like holes as mentioned above; therefore, the light-extraction efficiency of the light-emitting diode can be increased. Furthermore, filling the transparent insulating material having high refractive index into the plurality of pillar-like holes can not only lower the total reflection of the ray in the light-emitting diode, but also increase the anti-breakdown strength of the component. Additionally, the coating of the transparent conducting layer can make the driving current of the light-emitting diode surrounds with the primary illuminating region, so that the invention has various advantages of good current diffusion effect, good lighting uniformity, and decreasing the instantaneous discharge.

The objective of the present invention will no doubt become obvious to those of ordinary skill in the art after

BRIEF DESCRIPTION OF THE APPENDED DRAWINGS

Figure 1:
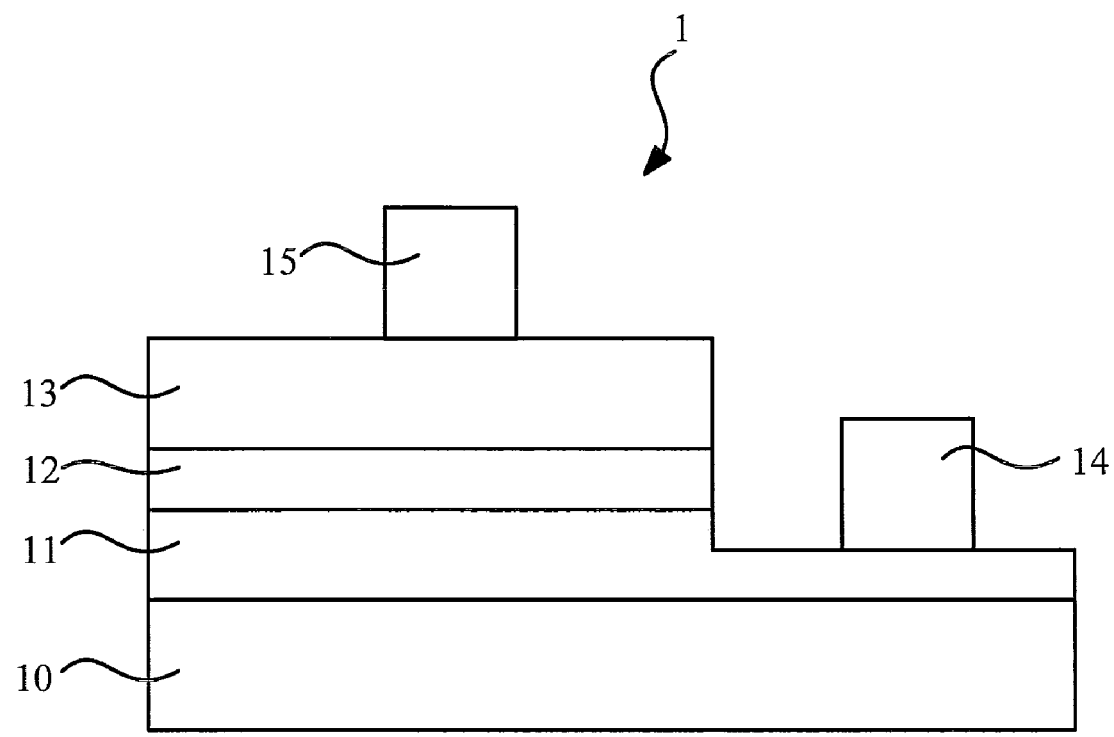
FIG. 1 illustrates a well-known light-emitting diode.
Figure 2A:
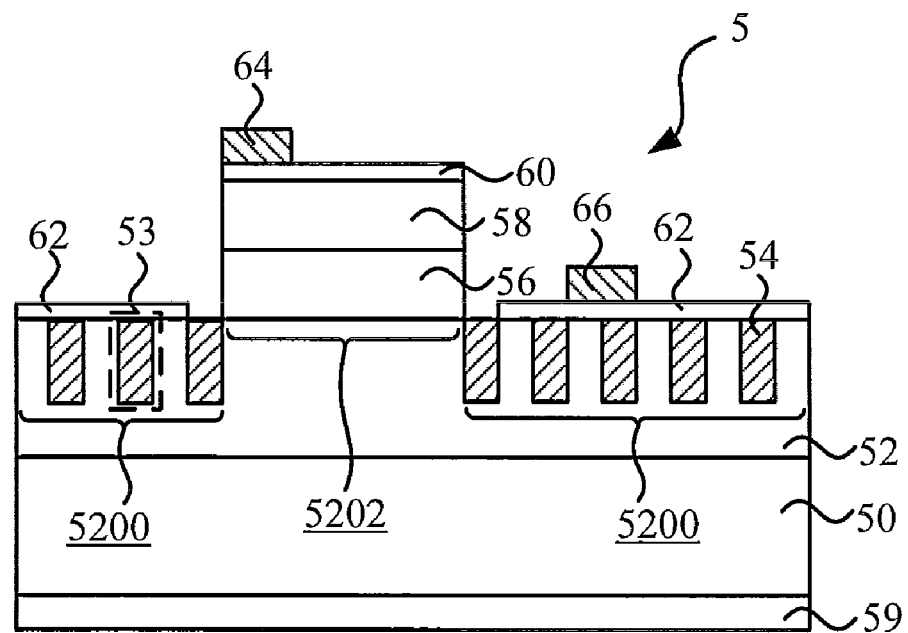
FIG. 2A illustrates a cross-sectional view of the light-emitting diode according to an embodiment of the invention.

FIG. 3A~FIG. 3H illustrate a cross-sectional view of the manufacturing method of the light-emitting diode shown in FIG. 2A.

Figure 3A:
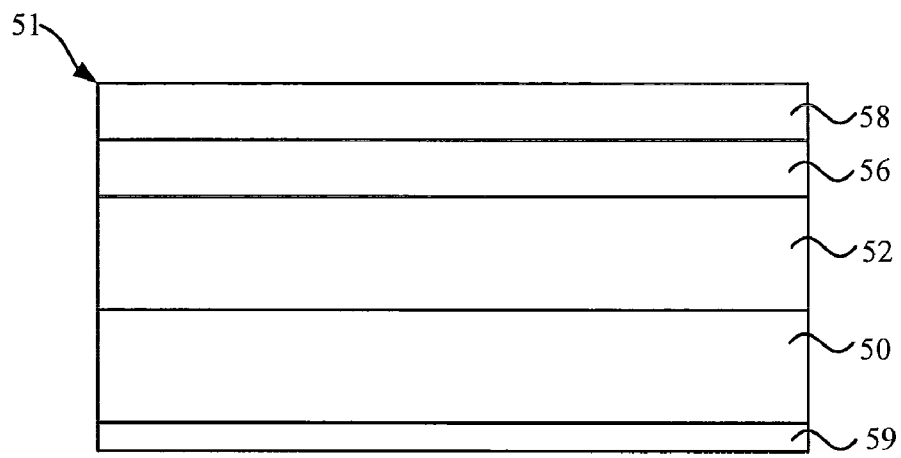
Figure 3B:
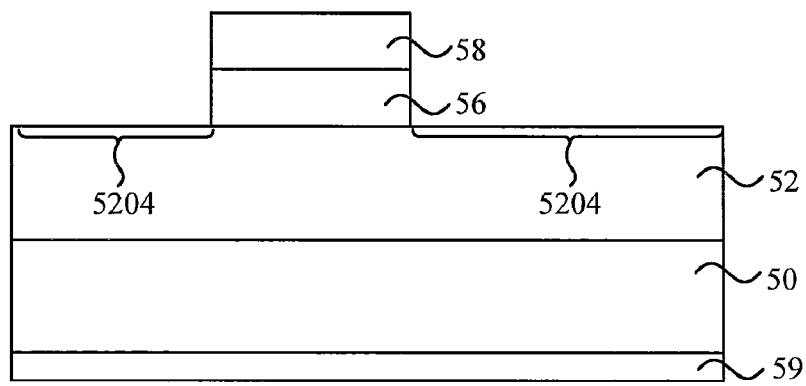
Figure 3C:
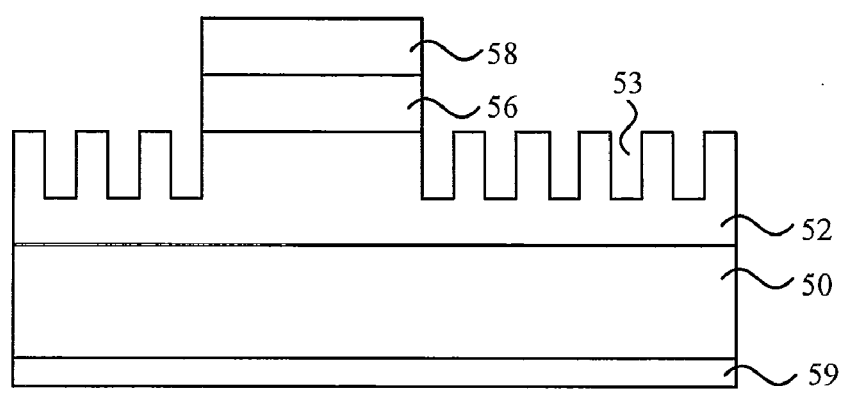
Figure 3D:
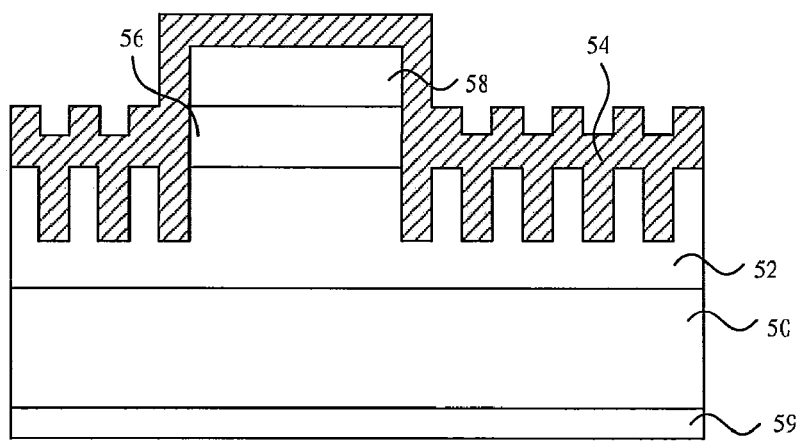
Figure 3E:
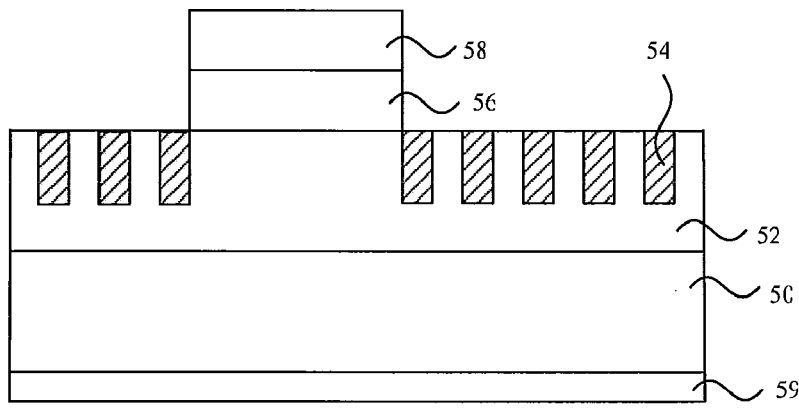
Figure 3F:
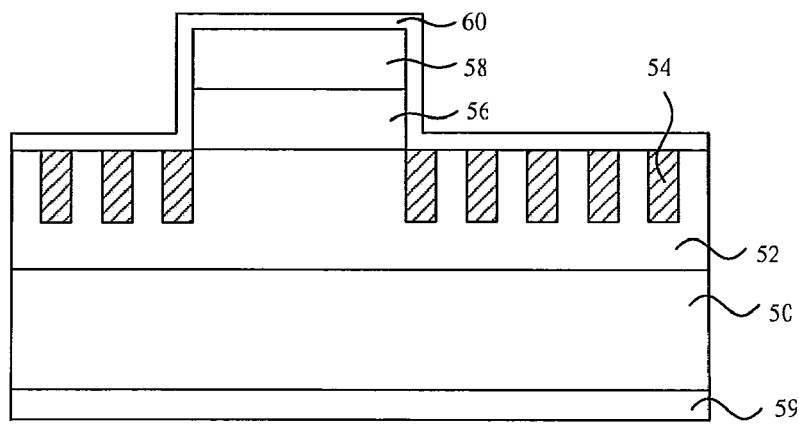
Figure 3G:
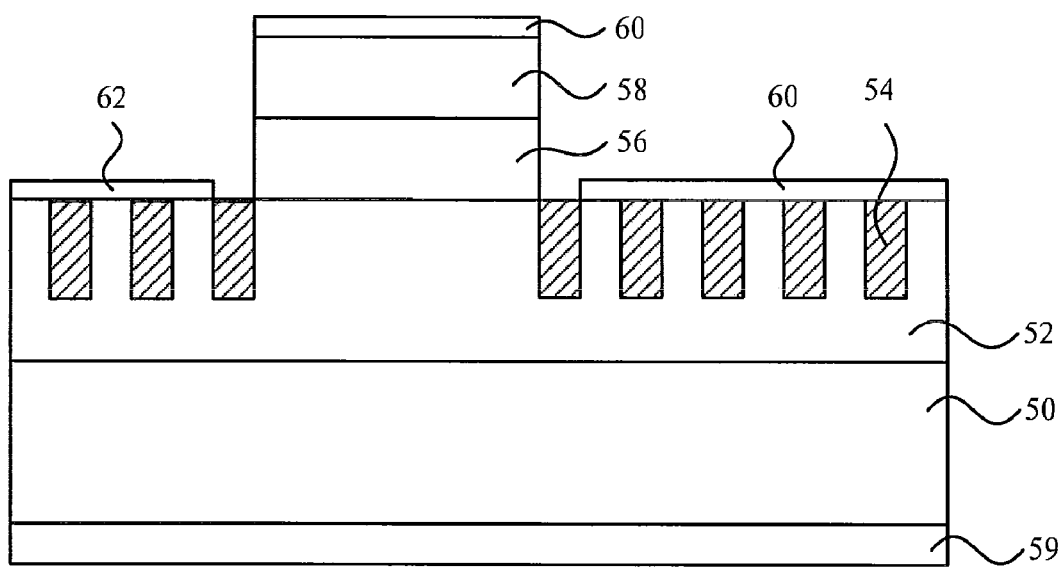
Figure 3H:
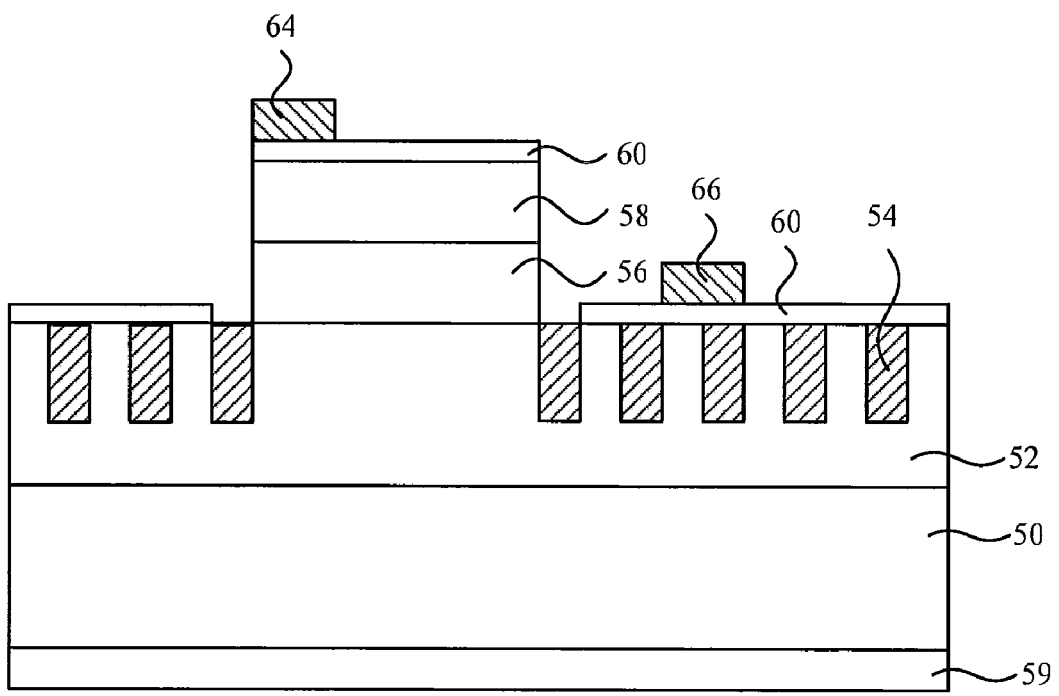
Figure 3I:
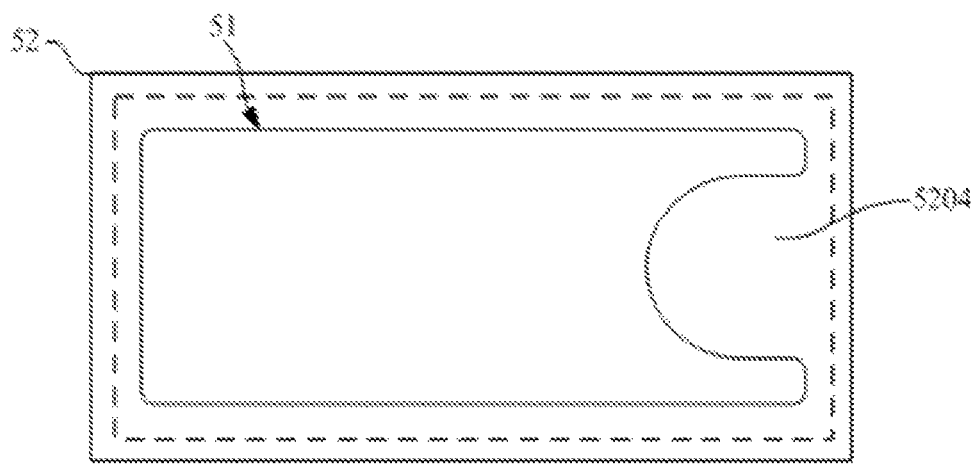

FIG. 3I illustrates a top view of the structure shown in FIG. 3B.

Figure 3J:
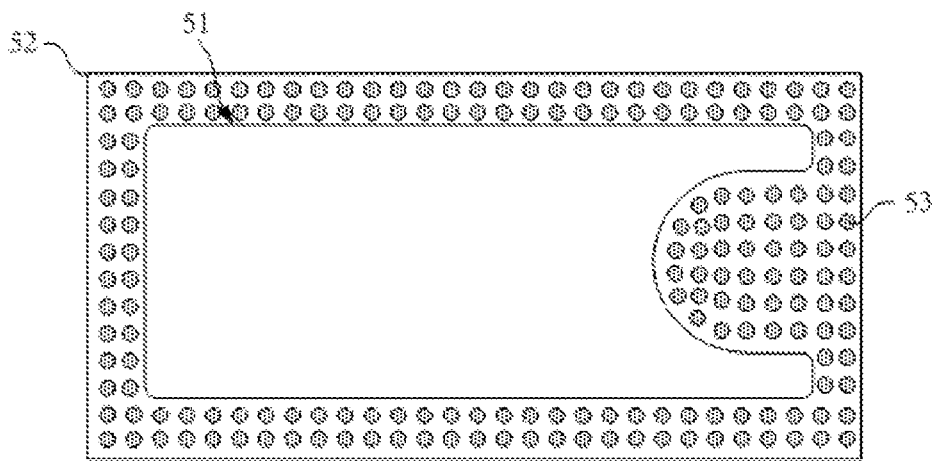

FIG. 3J illustrates a top view of the structure shown in FIG. 3C.

Figure 3K:
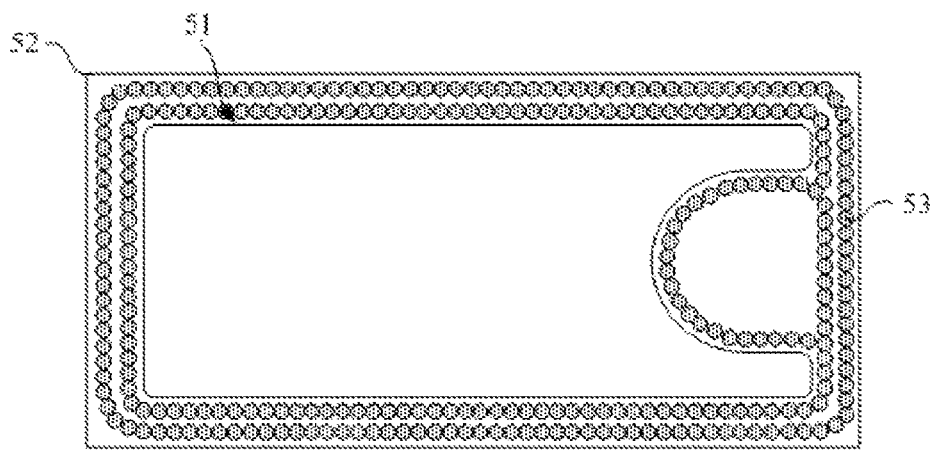

FIG. 3K illustrates a top view of the pillar-like holes arranged as an inner ring-like circle and an outer ring-like circle.

FIG. 4A~FIG. 4I illustrate a cross-sectional view of the manufacturing method of the light-emitting diode according to another embodiment of the invention.

Figure 4A:
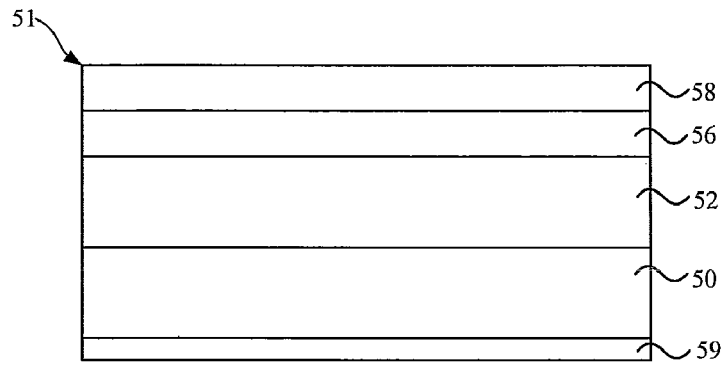
Figure 4B:
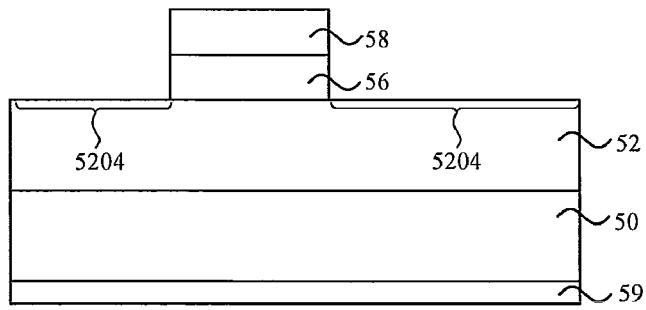
Figure 4C:
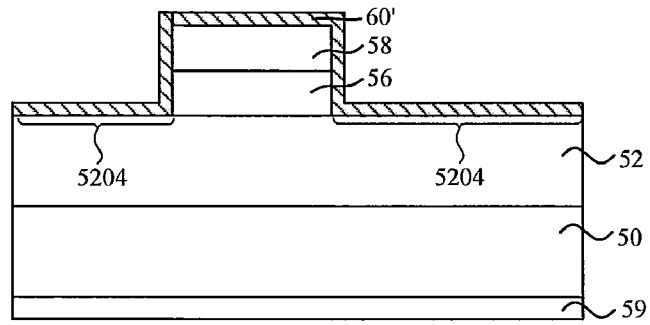
Figure 4D:
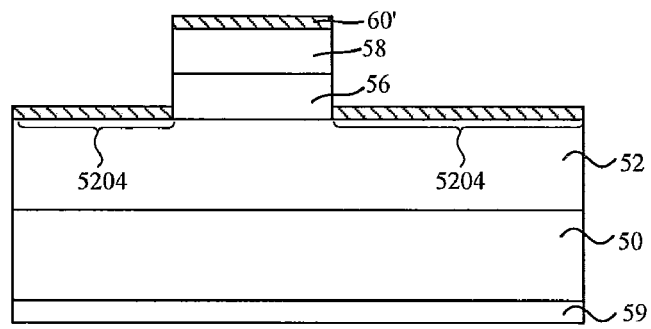
Figure 4E:
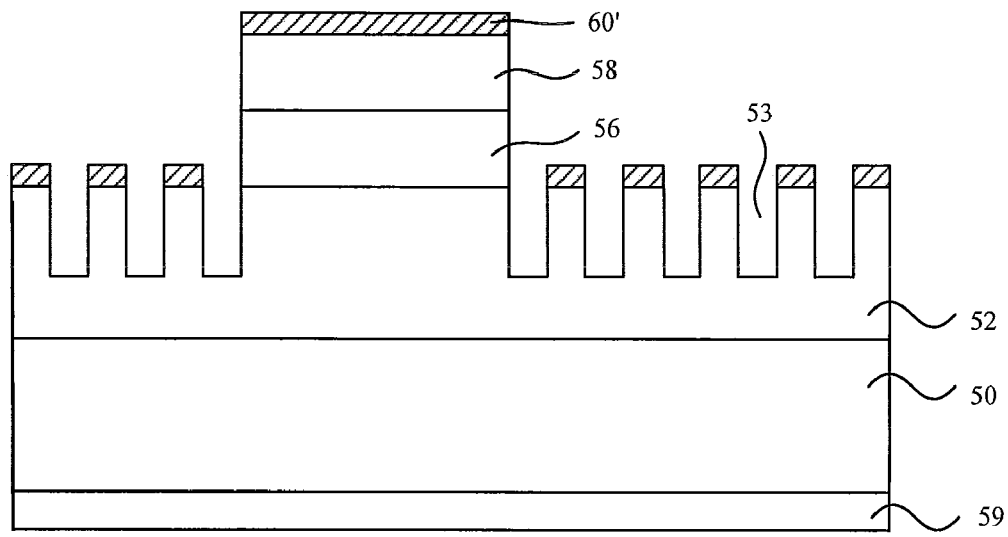
Figure 4F:
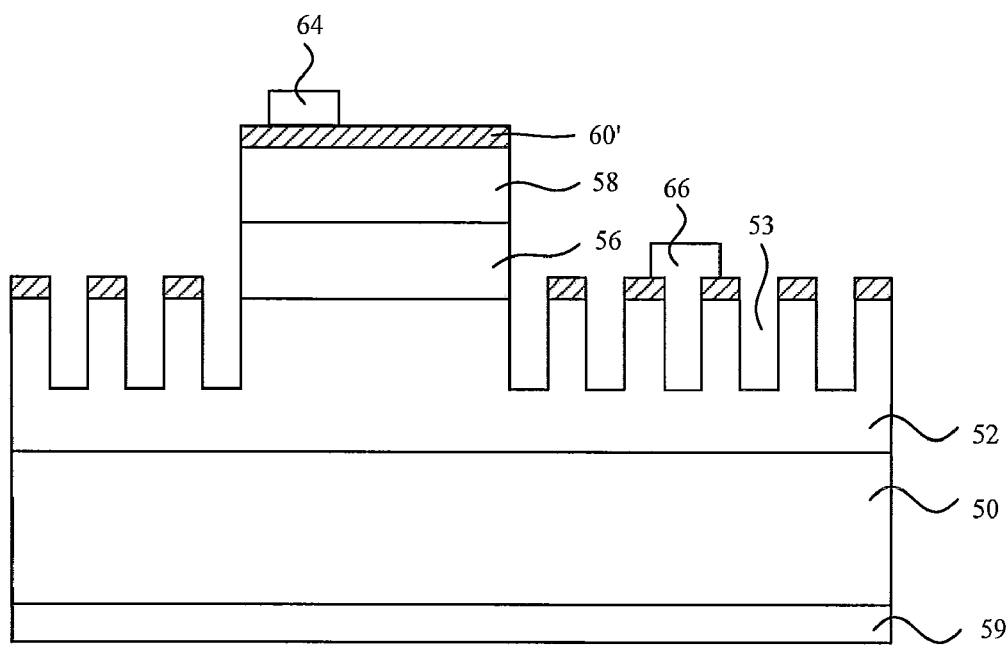
Figure 4G:
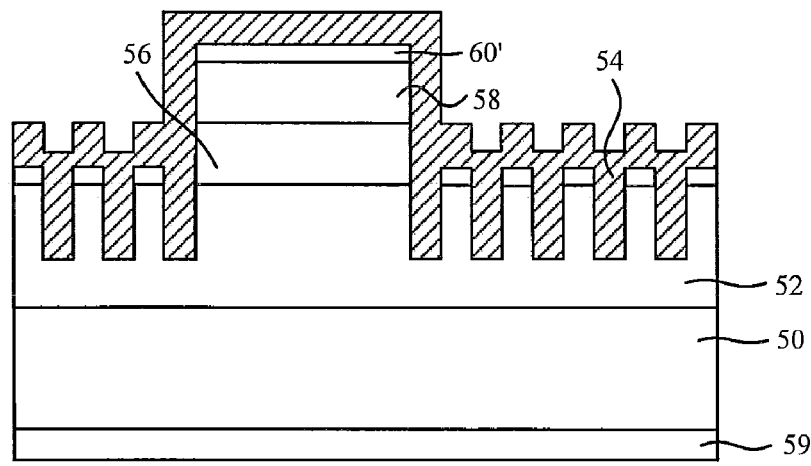
Figure 4H:
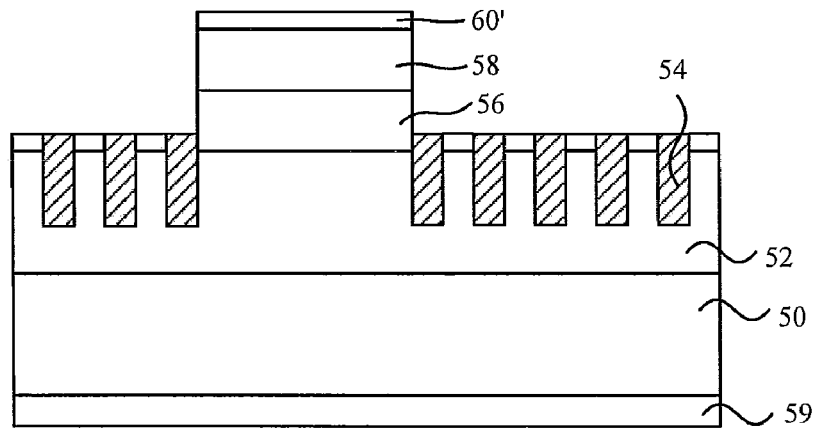
Figure 4I:
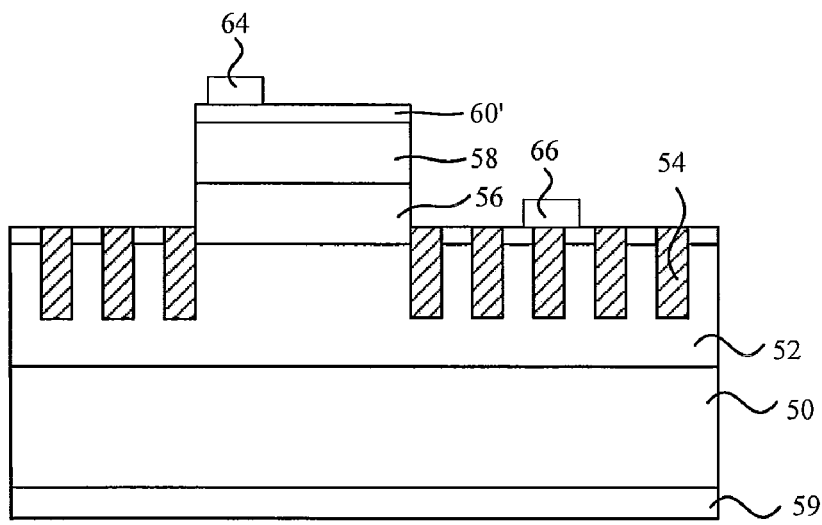
Figure 4J:
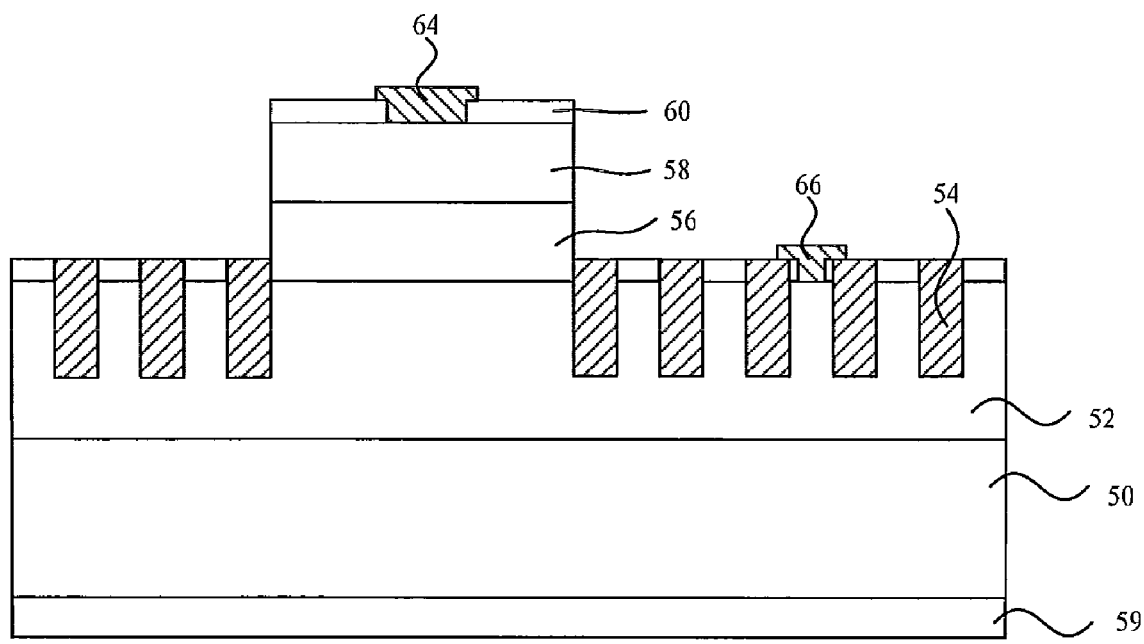

FIG. 4J illustrates a cross-sectional view of the light-emitting diode shown in FIG. 4I in another preferred embodiment.

Figure 5A:
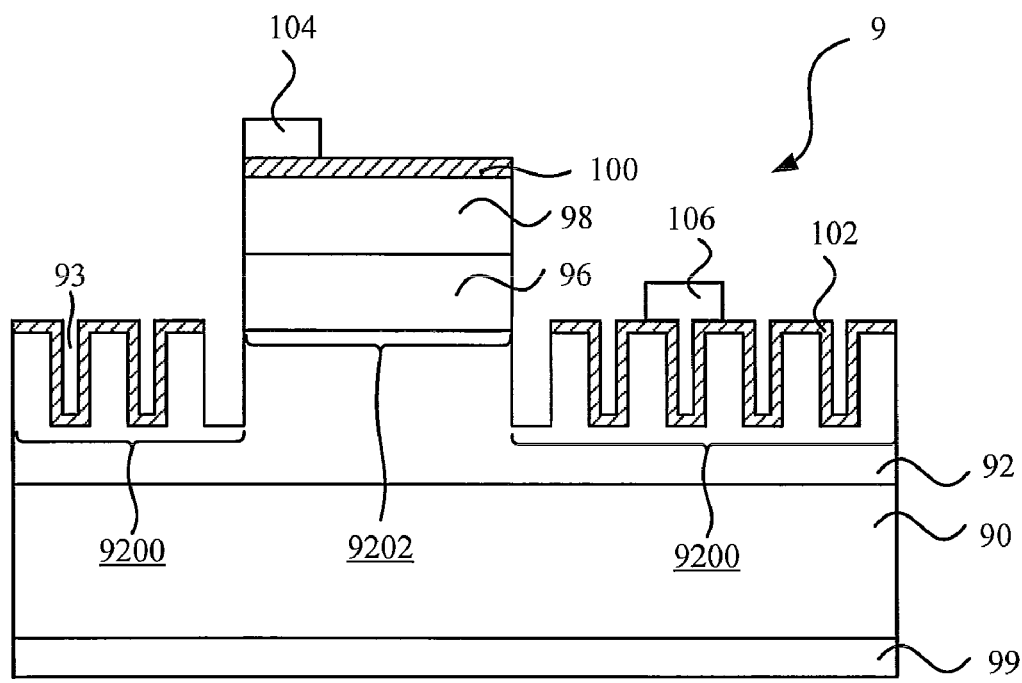

FIG. 5A illustrates a cross-sectional view of the light-emitting diode according to an embodiment of the invention.

Figure 5B:
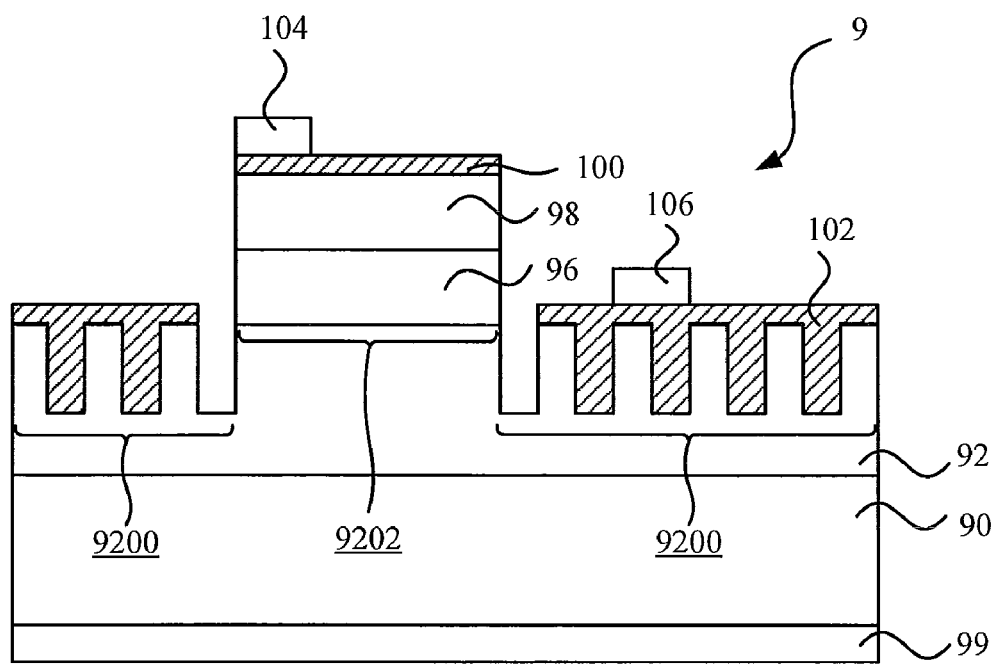

FIG. 5B illustrates a cross-sectional view of the light-emitting diode according to an embodiment of the invention.

Figure 5C:
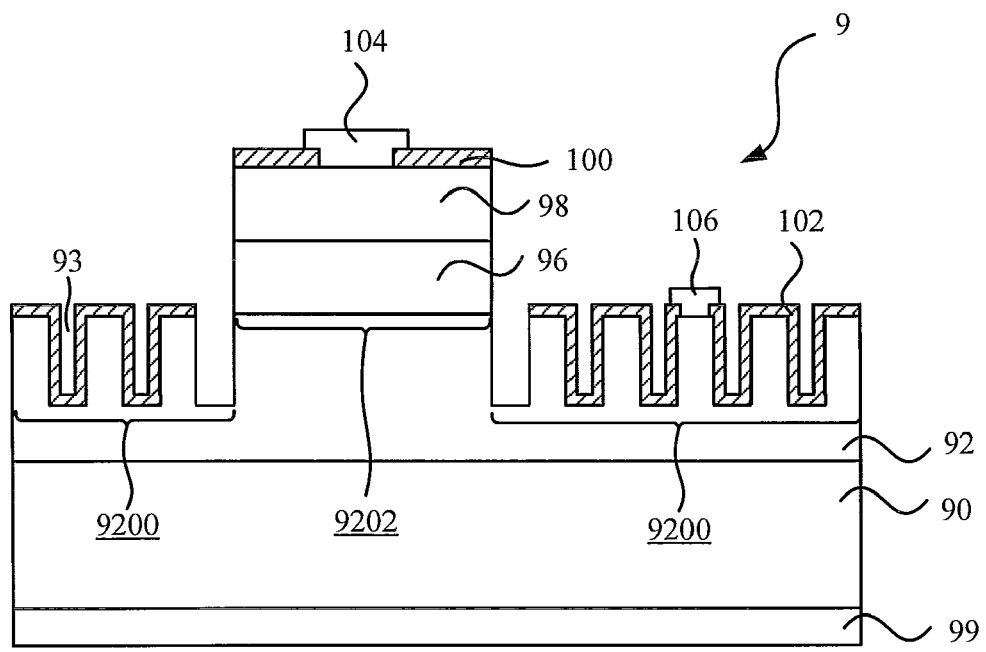

FIG. 5C illustrates a cross-sectional view of the light-emitting diode shown in FIG. 5A in another preferred embodiment.

Figure 5D:
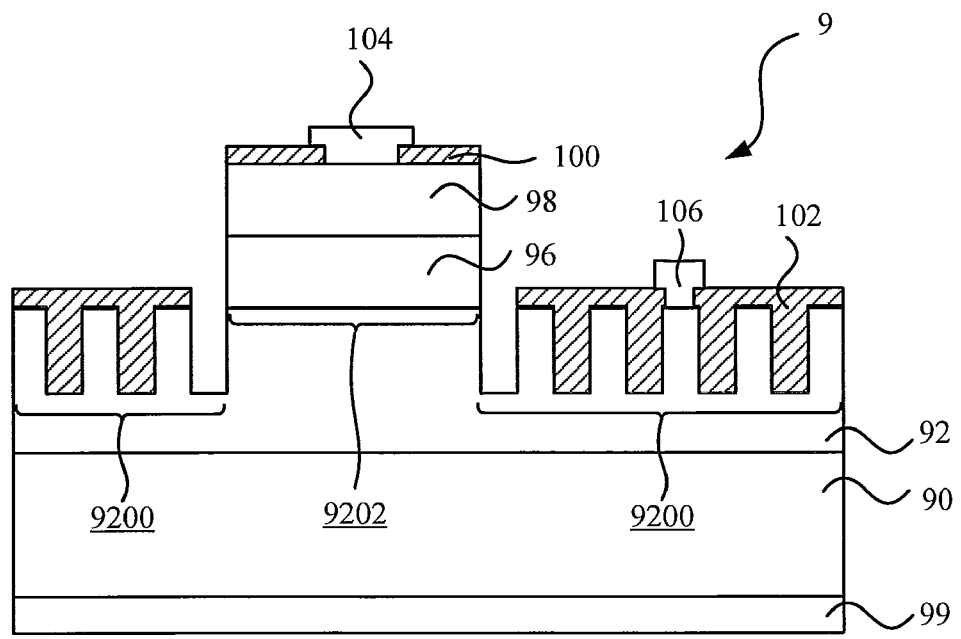

FIG. 5D illustrates a cross-sectional view of the light-emitting diode shown in FIG. 5B in another preferred embodiment.

FIG. 6A~FIG. 6F illustrate a cross-sectional view of the manufacturing method of the light-emitting diode shown in FIG. 5A.

DETAILED DESCRIPTION OF THE INVENTION

Please refer to FIG. 2A. FIG. 2A illustrates a cross-sectional view of the light-emitting diode 5 according to an embodiment of the invention.

The light-emitting diode 5 includes a substrate 50, a first conducting-type semiconductor layer 52, a transparent insulating material 54, an illuminating layer 56, a second conducting-type semiconductor layer 58, a first transparent conducting layer 60, a second transparent conducting layer 62, a first electrode 64, and a second electrode 66.

The first conducting-type semiconductor layer 52 is formed on the substrate 50 and the first conducting-type semiconductor layer 52 has an upper surface. The upper surface comprises a first region 5200 and a second region 5202 surrounded with the first region 5200, wherein a plurality of pillar-like holes 53 is formed in the first region 5200 and protrudes into the first conduction-type semiconductor layer 52. And, the transparent insulating material 54 is filled into the plurality of pillar-like holes 53, so that the filled transparent insulating material is about the same height as the plurality of pillar-like holes 53. In piratical applications, a cutting way is defined upon the substrate 50 (not shown in FIG. 2A), and the majority of pillar-like holes 53 are located on the cutting way approximately.

The illuminating layer 56 is formed on the second region 5202; the second conducting-type semiconductor layer 58 is formed on the illuminating layer 56, and the first transparent conducting layer 60 is formed on the second conducting-type semiconductor layer 58.

In practical applications, the first conducting-type semiconductor layer 52, the illuminating layer 56, and the second conducting-type semiconductor layer 58 can be formed by a nitride material. And in a preferred embodiment, the refractive index of the transparent insulating material 54 is between the refractive index of the air and the refractive index of the nitride material.

The second transparent conducting layer 62 is formed on a top surface of the transparent insulating material 54 and the first region 5200. Additionally, the first electrode 64 is formed upon the first transparent conducting layer 60, and the second electrode 66 is formed upon the second transparent conducting layer 62. In a preferred embodiment, the light-emitting diode 5 further includes a reflective layer 59 formed on a bottom surface of the substrate 50 to make the light-emitting diode 5 light upward.

Figure 2B:
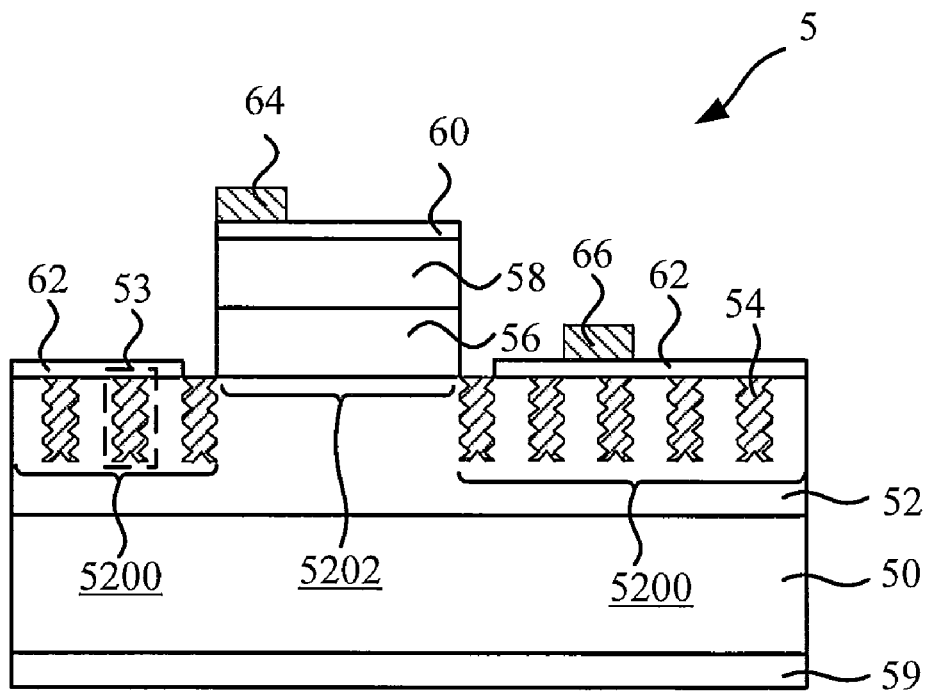
FIG. 2B illustrates a cross-sectional view of the rough surface of the pillar-like holes.
Figure 2C:
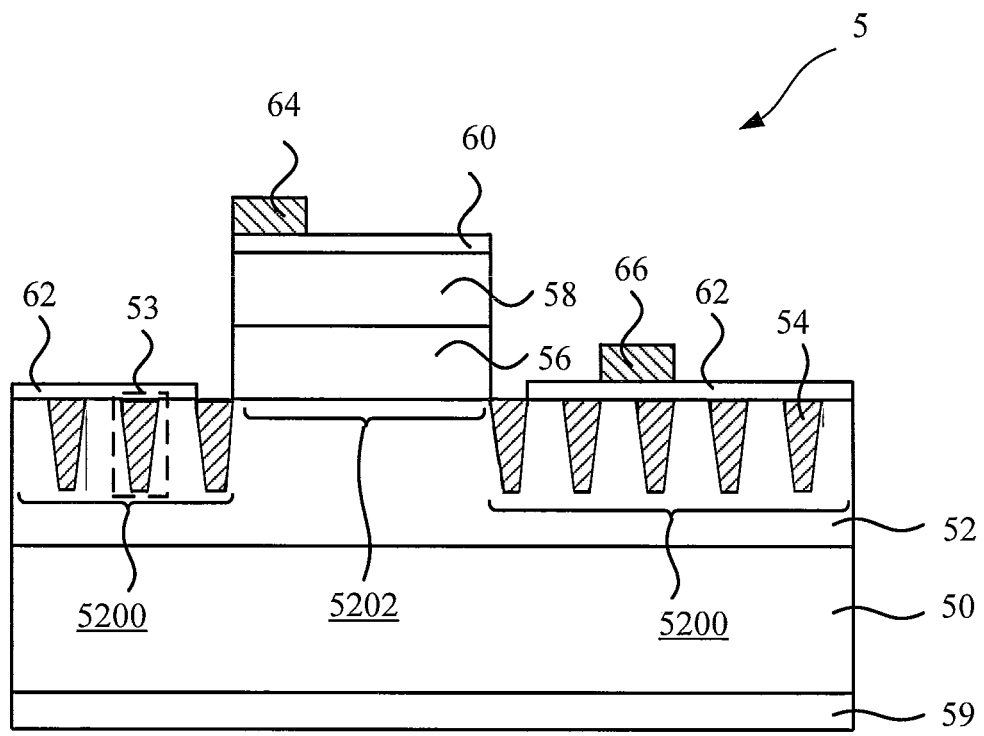
FIG. 2C illustrates a cross-sectional view of the counter-trapezoid cross-section of the pillar-like holes.

It should be noticed that the surface outline of the plurality of pillar-like holes 53 can be designed to further increase the illumining output efficiency of the LED. In a preferred embodiment, the plurality of pillar-like holes 53 has a rough sidewall and a rough bottom, as shown in FIG. 2B. In another preferred embodiment, the plurality of pillar-like holes 53 has a counter-trapezoid cross-section, i.e., generally tapered cross-section, as shown in FIG. 2C.

Figure 2D:
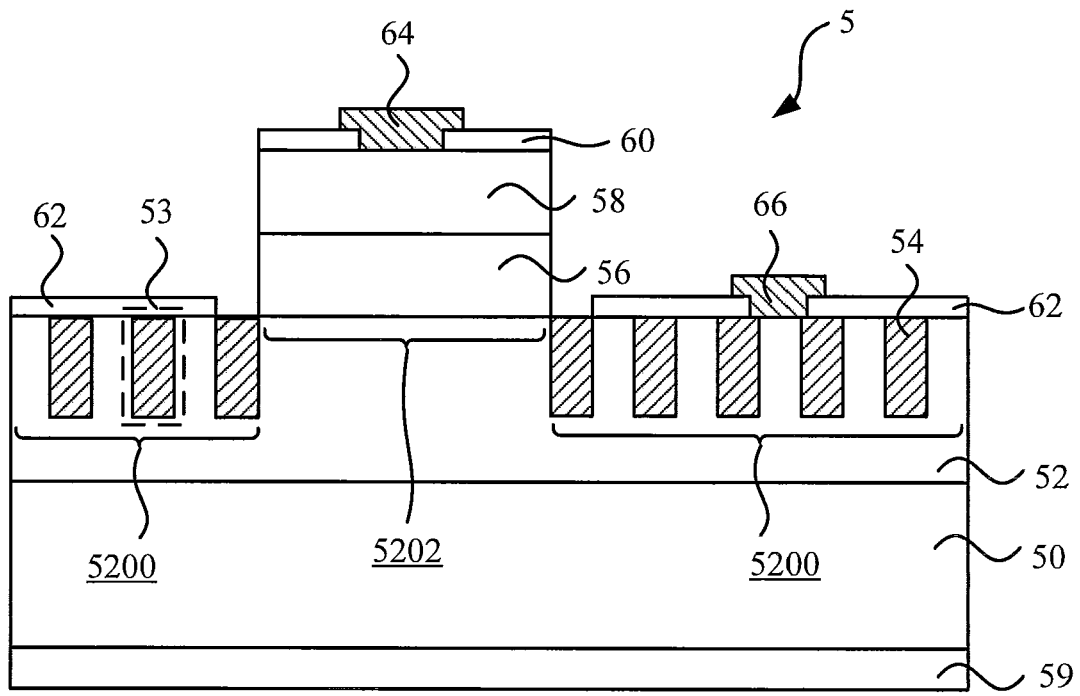
FIG. 2D illustrates a cross-sectional view of the light-emitting diode shown in FIG. 2A in another embodiment.

Please refer to FIG. 2D. FIG. 2D illustrates a cross-sectional view of the light-emitting diode 5 shown in FIG. 2A in another embodiment. As shown in FIG. 2D, a part of the first transparent conducting layer 60 is removed, so that a part of the top surface of the second conducting-type semiconductor layer 58 is exposed. The first electrode 64 is formed upon the exposed top surface of the second conducting-type semiconductor layer 58 and the first electrode 64 contacts with the first transparent conducting layer 60. Additionally, a part of the second transparent conducting layer 62 is removed, so that a part of the first region 5200 on the upper surface of the first conducting-type semiconductor layer 52 is exposed. The second electrode 66 is formed upon the exposed first region 5200 and the second electrode 66 contacts with the second transparent conducting layer 62.

Please refer to FIG. 3A to FIG. 3H together. FIG. 3A to FIG. 3H illustrate a cross-sectional view of the manufacturing method of the light-emitting diode 5 in the above-mentioned embodiment.

Firstly, as shown in FIG. 3A, the first conducting-type semiconductor layer 52, the illuminating layer 56 and the second conducting-type semiconductor layer 58 are formed on the substrate 50 by the method to make a semiconductor stack structure 51. In a preferred embodiment, the method further forms a reflective layer 59 on a bottom surface of the substrate 50 to make the light-emitting diode 5 light upward.

Next, as shown in FIG. 3B, a first etching process is performed on the semiconductor stack structure 51 shown in FIG. 3A until a surrounding region 5204 of an upper surface of the first conducting-type semiconductor layer 52 is exposed. Please also refer to FIG. 3B and FIG. 3I, FIG. 3I illustrates a top view of the structure shown in FIG. 3B. It should be noticed that the surrounding region 5204 in FIG. 3I refers to first region 5200 in FIG. 2A, and the position of the dotted-line can represent the position of the cutting line defined on the substrate 50.

Then, as shown in FIG. 3C, a second etching process is performed on the exposed surrounding region 5204, so that the plurality of pillar-like holes 53 is formed in the surrounding region 5204 and the plurality of pillar-like holes 53 protrudes into the first conduction-type semiconductor layer 52. Please refer to FIG. 3C and FIG. 3J together. FIG. 3J illustrates a top view of the structure shown in FIG. 3C, and the plurality of pillar-like holes 53 can be uniformly distributed on the surrounding region 5204. Comparing FIG. 3I with FIG. 3J, the majority of pillar-like holes 53 can be located on the cutting way approximately.

Moreover, in an embodiment, the plurality of pillar-like holes 53 can form at least one ring-like circle to surround the illuminating layer, and each ring-like circle is formed by mutually connecting the plurality of pillar-like holes 53 approximately. As shown in FIG. 3K, the plurality of pillar-like holes 53 can be arranged and formed a pattern of an inner ring-like circle and an outer ring-like circle to guarantee that the plurality of pillar-like holes 53 will guide all the lights emitted by the light outputting plane to the illuminating layer of the light-emitting diode.

Next, as shown in FIG. 3D, the method is performed to cover the transparent insulating material 54 with the entire component, and also fill the transparent insulating material 54 into the plurality of pillar-like holes 53, as shown in FIG. 3C.

Next, as shown in FIG. 3E, the method can use a selective etching method to remove the unnecessary insulating material 54, so that the filled transparent insulating material 54 is about the same height as the plurality of pillar-like holes 53.

Next, as shown in FIG. 3F, the method is performed to form the transparent conducting layer 60 to cover the entire component shown in FIG. 3E.

Next, as shown in FIG. 3G, the method can use the etching method to remove both of the transparent conducting layer 60 on the sidewall of the central stack structure, and the transparent conducting layer 60 between the central stack structure and the pillar-like holes 53 to avoid current leakage.

At last, as shown in FIG. 3H, the first electrode 64 and the second electrode 66 are formed on the transparent conducting layer 60 of the central stack structure respectively, and the first electrode 64 and the second electrode 66 are formed on the transparent conducting layer 60 of the surrounding region respectively.

Please refer to FIG. 4A~FIG. 4I. FIG. 4A~FIG. 4I illustrate a cross-sectional view of the manufacturing method of the light-emitting diode according to another embodiment of the invention.

Firstly, as shown in FIG. 4A, the method continuously forms the first conducting-type semiconductor layer 52, the illuminating layer 56, and the second conducting-type semiconductor layer 58 on the substrate 50 to make a semiconductor stack structure 51. In a preferred embodiment, the method further forms a reflective layer 59 on a bottom surface of the substrate 50 to make the light-emitting diode 5 light upward.

Next, as shown in FIG. 4B, an etching process is performed on the semiconductor stack structure 51 in FIG. 4A until a surrounding region 5204 on an upper surface of the first conducting-type semiconductor layer 52 is exposed.

Next, as shown in FIG. 4C, a transparent conducting layer 60' is formed to fully coat the entire component shown in FIG. 4B.

Next, as shown in FIG. 4D, the method can use the etching method to remove the transparent conducting layer 60' on the sidewall of the central stack structure.

Then, as shown in FIG. 4E, a etching process is performed on the transparent conducting layer 60' of the surrounding region, so that the plurality of pillar-like holes 53 is formed in the transparent conducting layer 60' and the plurality of pillar-like holes 53 protrudes into the first conduction-type semiconductor layer 52.

Afterward, as shown in FIG. 4F, the first electrode 64 and the second electrode 66 are formed on the transparent conducting layer 60' of the central stack structure respectively and the first electrode 64 and the second electrode 66 are formed on the transparent conducting layer 60' of the surrounding region respectively.

In an embodiment, after the step shown in FIG. 4E, the method is performed to cover the transparent insulating material 54 with the entire component shown in FIG. 4E, and also fill the transparent insulating material 54 into the plurality of pillar-like holes 53, as shown in FIG. 4G.

Next step, as shown in FIG. 4H, the method can use the selective etching method to remove the unnecessary insulating material 54, so that the transparent insulating material 54 filled into the plurality of pillar-like holes 53 is about the same height as the plurality of pillar-like holes 53. Afterward, as shown in FIG. 4I, the first electrode 64 and the second electrode 66 are formed on the transparent conducting layer 60' of the central stack structure and the transparent conducting layer 60' of the surrounding region respectively.

Please refer to FIG. 4J. FIG. 4J illustrates a cross-sectional view of the light-emitting diode in another preferred embodiment shown in FIG. 4I. Basically, the locating method related to the first electrode 64 and the second electrode 66 shown in FIG. 4J is the same with that of FIG. 2D, so it will no longer be explained here.

Please refer to FIG. 5A. FIG. 5A illustrates a cross-sectional view of the light-emitting diode 9 according to an embodiment of the invention.

The light-emitting diode 9 includes a substrate 90, a first conducting-type semiconductor layer 92, an illuminating layer 96, a second conducting-type semiconductor layer 98, a first transparent conducting layer 100, a second transparent conducting layer 102, a first electrode 104, and a second electrode 106.

The first conducting-type semiconductor layer 92 is formed on the substrate 90 and the first conducting-type semiconductor layer 92 has an upper surface. The upper surface includes a first region 9200 and a second region 9202 surrounded by the first region 9200. Wherein, a plurality of pillar-like holes 93 is formed in the first region 9200 and the plurality of pillar-like holes 93 protrudes into the first conduction-type semiconductor layer. In practical applications, a cutting way (not shown in FIG. 5A) is defined upon the substrate, and the majority of pillar-like holes can be located on the cutting way approximately.

As shown in FIG. 5A, the illuminating layer 96 is formed on the second region 9202, and the second conducting-type semiconductor layer 98 is formed on the illuminating layer 96. The first transparent conducting layer 100 is formed on the second conducting-type semiconductor layer 98, and the second transparent conducting layer 102 is coated on the surface of the plurality of pillar-like holes 93 and the first region 9200. It should be noticed, in practical applications, the second transparent conducting layer 102 can further be filled into the plurality of pillar-like holes 93, as shown in FIG. 5B.

As shown in FIG. 5A, the first electrode 104 is formed upon the first transparent conducting layer 100, and the second electrode 106 is formed upon the second transparent conducting layer 102. In a preferred embodiment, the light-emitting diode 9 further includes a reflective layer 99 formed on a bottom surface of the substrate 90 to make the light-emitting diode 9 light upward.

It should be noticed that the surface outline of the plurality of pillar-like holes 93 can be designed to further increase the illumining output efficiency. In a preferred embodiment, the plurality of pillar-like holes 53 has a rough sidewall and a rough bottom (please refer to FIG. 2B again). In another preferred embodiment, the plurality of pillar-like holes 93 has a counter-trapezoid cross-section (please refer to FIG. 2C again).

Please refer to FIG. 5C and FIG. 5D. FIG. 5C illustrates a cross-sectional view of the light-emitting diode 9 in another embodiment shown in FIG. 5A. FIG. 5D illustrates a cross-sectional view of the light-emitting diode 9 in another embodiment shown in FIG. 5B. Basically, the locating method of the first electrode 104 and the second electrode 106 shown in FIG. 5C and FIG. 5D is the same with that of FIG. 2D, so it will no longer be explained here.

Please refer to FIG. 6A to FIG. 6F together. FIG. 6A to FIG. 6F illustrate cross-sectional views of the manufacturing method of the light-emitting diode 9 in the above-mentioned embodiment.

Figure 6A:
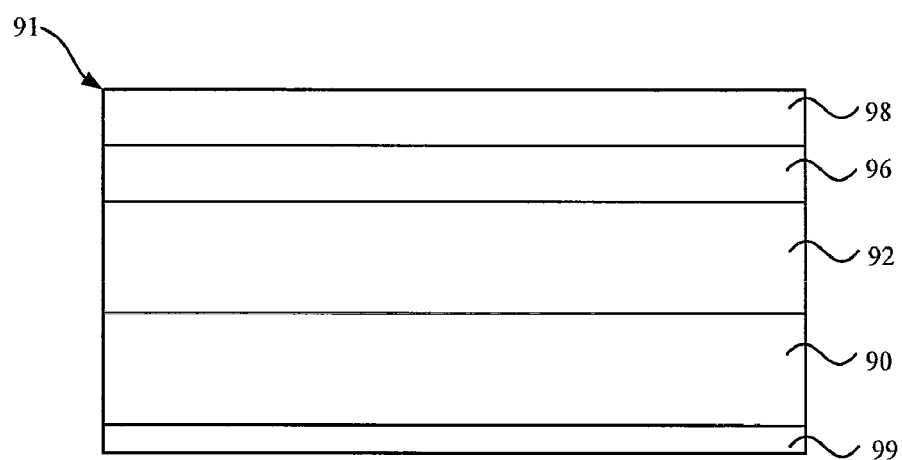

Firstly, as shown in FIG. 6A, the method continuously forms the first conducting-type semiconductor layer 92, the illuminating layer 96, and the second conducting-type semiconductor layer 98 on the substrate 90 to make a semiconductor stack structure 91. In a preferred embodiment, the method further forms a reflective layer 99 on a bottom surface of the substrate 90 to make the light-emitting diode 9 light upward.

Figure 6B:
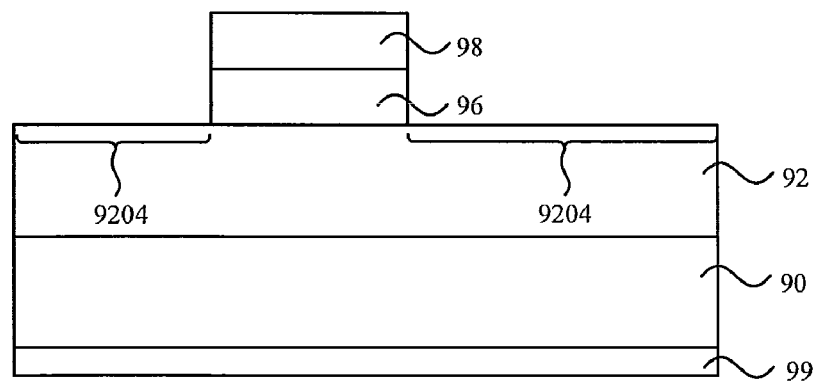

Next, as shown in FIG. 6B, a first etching process is performed on the semiconductor stack structure 91 shown in FIG. 6A until a surrounding region 9204 on an upper surface of the first conducting-type semiconductor layer 92 is exposed.

Figure 6C:
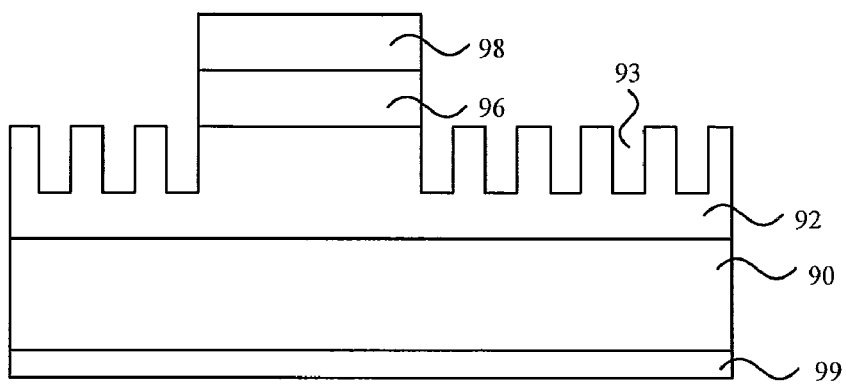

Next, as shown in FIG. 6C, a second etching process is performed on the exposed surrounding region 9204, so that the plurality of pillar-like holes 93 is formed in the surrounding region 9204 and the plurality of pillar-like holes 93 protrudes into the first conduction-type semiconductor layer 92. In practical applications, a cutting way is defined upon the substrate 90, and the plurality of pillar-like holes 93 can be located on the cutting way approximately.

Figure 6D:
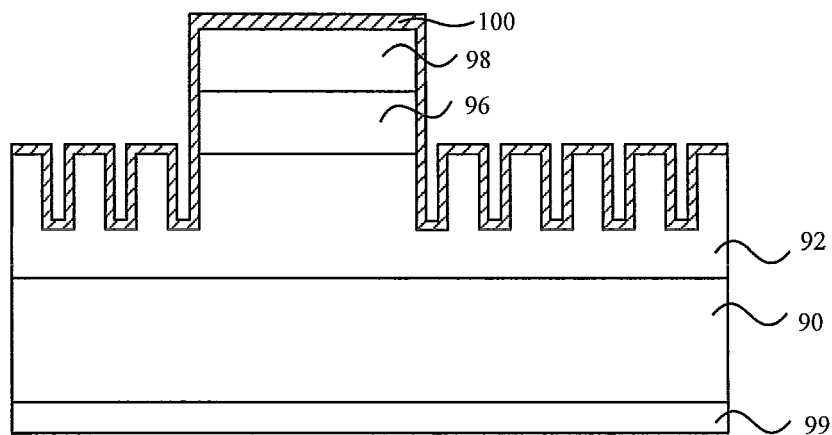

Next, as shown in FIG. 6D, the transparent conducting layer 100 is formed to cover the entire component shown in FIG. 6C.

Figure 6E:
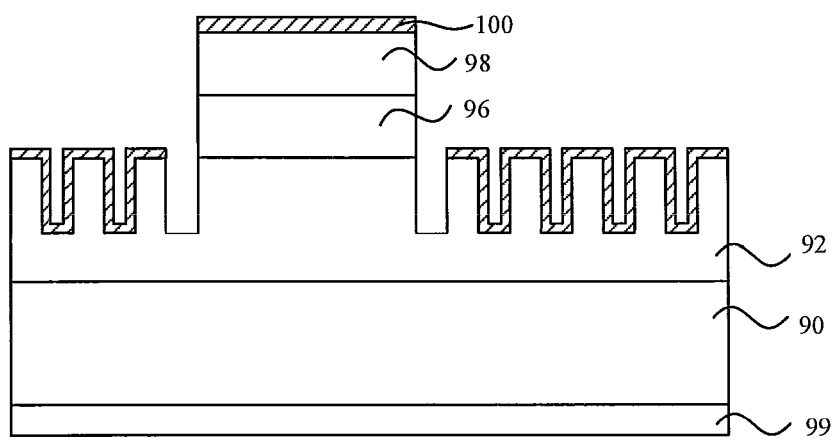

Next, as shown in FIG. 6E, the method can use the etching method to remove both of the transparent conducting layer 100 on the sidewall of the central stack structure and the transparent conducting layer 100 between the central stack structure and the pillar-like holes 93. It should be noticed, in practical applications, the second transparent conducting layer 100 can further be filled into the plurality of pillar-like holes 93, as shown in FIG. 5B.

Figure 6F:
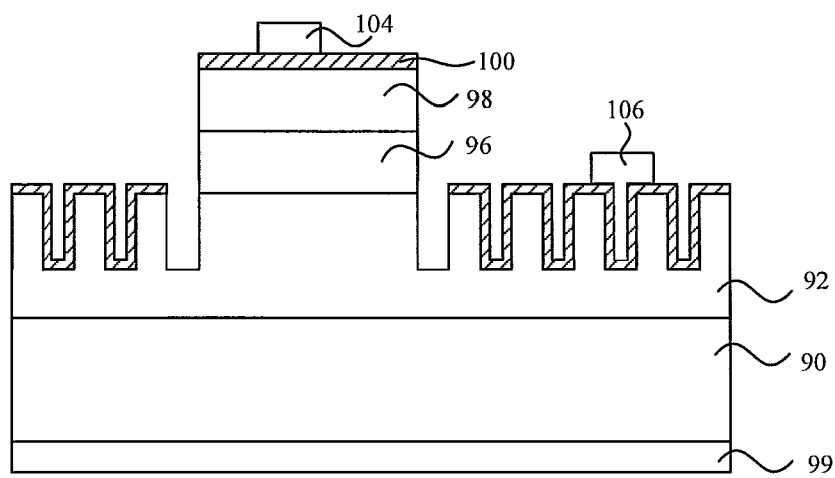

At last, as shown in FIG. 6F, the first electrode 104 and the second electrode 106 are formed on the transparent conducting layer 100 of the central stack structure and the transparent conducting layer 100 of the surrounding region respectively.

Compared to prior arts, the light-emitting diode of the invention includes the plurality of pillar-like structures or the plurality of pillar-like holes as mentioned above, so that the light-emitting diode can increase the light-extraction efficiency. Furthermore, filling the transparent insulating material with the high refractive index into the plurality of pillar-like holes can not only lower the total reflection of the ray in the light-emitting diode, but also increase the anti-breakdown strength of the component. Additionally, the coating of the transparent conducting layer can make the driving current of the light-emitting diode surround the primary illuminating region, so that the invention has various advantages of good current diffusion effect, good lighting uniformity, and decreasing the instantaneous discharge.

Although the present invention has been illustrated and described with reference to the preferred embodiment thereof, it should be understood that it is in no way limited to the details of such embodiment but is capable of numerous modifications within the scope of the appended claims.

What is claimed is:

1. A light-emitting diode, comprising:
a substrate;
a first conducting-type semiconductor layer being formed on the substrate and having an upper surface, the upper surface comprising a first region and a second region surrounded by the first region, wherein a plurality of pillar-like holes are formed in the first region and protrude into the first conducting-type semiconductor layer;
a transparent insulating material being filled into the plurality of pillar-like holes;
an illuminating layer being formed overlying the second region rather than the first region;
a second conducting-type semiconductor layer being formed overlying the illuminating layer;
a first transparent conducting layer being formed overlying the second conducting-type semiconductor layer; and
a second transparent conducting layer being formed overlying the first region and whereby covering the top surface of the transparent insulating material.

2. The light-emitting diode of claim 1, wherein a cutting line is defined upon the substrate, and the plurality of pillar-like holes are located on the cutting line approximately.

3. The light-emitting diode of claim 1, wherein the refractive index of the transparent insulating material is between the refractive index of the air and the refractive index of the nitride material.

4. The light-emitting diode of claim 1, wherein the plurality of pillar-like holes has a rough surface.

5. The light-emitting diode of claim 1, wherein each of the plurality of pillar-like holes has a tapered cross-section.

6. The light-emitting diode of claim 1, wherein the plurality of pillar-like holes forms at least one ring-like circle to surround the illuminating layer, and the pillar-like holes in each ring-like circle are mutually connected with each other approximately.

7. The light-emitting diode of claim 1, wherein the top surface of the filled transparent insulating material is about the same height as the top end surface of the plurality of pillar-like holes.

* * * * *